United States Patent Office 3,578,458

Patented May 11, 1971

3,578,458

IONICALLY CROSS-LINKED PHOTOPOLYMERIZED ADDITION POLYMERS

Lloyd D. Taylor, Everett, Mass., assignor to Polaroid Corporation, Cambridge, Mass.

No Drawing. Filed Oct. 5, 1966, Ser. No. 584,353
Int. Cl. G03c *1/68*
U.S. Cl. 96—115 1 Claim

ABSTRACT OF THE DISCLOSURE

Unsaturated monomers containing ionic sites are photopolymerized and, further, ionically cross-linked through these sites. Examples of unsaturated monomers containing ionic sites are zwitterions.

This invention relates to photo-resists and to the manufacture of polyionic photo-resists using charged compounds which are sensitive to light. The invention also relates to the photo-polymerization of polyionic compounds using actinic radiation as the polymerization initiator with the formation of coherent plastic masses or bodies.

Basically, a photo-resist is a resist in which a layer of material is coated onto a surface and then exposed to actinic radiation through a master image or pattern to effect a change in physical characteristics of the material as a function of the point to point exposure of the material to incident radiation. Usually, the material becomes more insoluble where exposed. When the layer is treated in a suitable solvent, the more soluble parts are removed thereby leaving an imagewise stencil on the support. This resultant image can then act as a resist against chemical attack of the support surface or it may be used as a mask or stencil through which light radiation may be modulated due to selective absorptivity of the resist material, the configuration of the exit light being a function of the resist image. In most cases the resist image can itself be colored to act as a decorative design or it can be made grease-accepting to provide a lithographic printing image.

The first known resist material was bitumen prepared from Judea asphalt which, when exposed for several hours to light, became insoluble in a mixture of lavender oil and mineral spirit. Using this technique, images were obtained on silvered glass which became the world's first photographs. It is most likely that prolonged exposure to short-wave length radiation removed some of the unsaturation of the bitumen and slightly changed its solubility characteristics because of cross-links that formed in the structure. These cross-links may be visualized as knitting together linear chains of the bitumen polymer into a three-dimensional structure, greatly increasing its molecular weight and rendering it less soluble.

A much more important development in photo-resist technology was the use of chromium salts to insolubilize colloids or resins and for almost a century this system has maintained its hold in the photo-mechanical arts. As is well known, many natural colloids and synthetic resins can be photo-cross-linked when sensitized with a dichromate salt. It is usually assumed that the effect of light is to reduce a small amount of the dichromate to produce the trivalent chromium ion and at the same time oxidize the colloid or resin, which becomes cross-linked. The main drawbacks to the dichromate system are first: the instability of the coated layer and its tendency to insolubilize in the dark, and second: the fact that only water soluble colloids respond very well to dichromate sensitizing. Also dichromate salts are strongly dermatitic in nature.

In the most recent industrial photo-resist systems many of the earlier difficulties have been overcome. One important system is based on cinnamic acid wherein the inherent light sensitivity of the substance provides a means of obtaining a synthetic photosensitive resin. It has long been known that cinnamic acid dimerizes when exposed to light. Two molecules combined to produce the optically isomeric truxinic and truxilic acids. Exploitation of this effect resulted in the synthesizing of cinnamic acid esters of, for example, polyvinyl alcohol and cellulose, which form polymers with built-in photosensitive groups.

Most photo-resist systems can be divided into two classes. In one class a colloid or synthetic polymer is cross-linked by the addition of a photosensitive compound that decomposes to form an active species that insolubilizes the surrounding vehicle or binder, as, for example, the above-mentioned dichromate process. The other class consists of polymers and monomers that have light-sensitive groups built into their structures so that irradiation cross-links are formed between polymer molecules or polymerization is effected to greatly lower their solubility, as, for example, in the case of polyvinyl cinnamate. The latter class is considered to include processes in which long-chain polymerization, as compared to dimerization, provides the means for insolubilization. In the long-chain polymerization process, a simple monomeric substance is caused to link with several of its neighbors to give a large molecular structure or polymer and this linking process can, under certain conditions, be triggered by light absorption. Thus, if methyl acrylate is placed in sunlight for a long time it will be transformed into a transparent, odorless mass of polymethylacrylate. In this respect it should be noted that photo-polymerization often proceeds at a very much slower rate than polymerization brought about by a catalyst such as a peroxide or heat, and may result in low molecular weight polymers.

An especially valuable and intriguing application of photo-polymerization involves using a light image or other radiation patterns to bring about imagewise polymerization of photo-polymerizable substances. The general technique involves coating a suitable base or support, usually transparent, wtih a photo-polymerizable reactant, or reactants, followed by exposure to a pattern of radiation actinic to the reactants, e.g., high-intensity light. In the exposed areas the reactants are polymerized to a more or less hard and insoluble mass whereas the unexposed areas are unaffected and consist of the original reactants which are removed, usually by solvent contact, e.g., a simple washing operation. There is thus obtained in the exposed area a polymeric relief image or raised resist of insoluble polymer or copolymer.

All presently known photo-resists which are based upon polymerization reactions contain light induced covalent bonds between the polymer chains, thereby constituting a photo vulcanizate, such as photo-exposed polyvinyl cinnamate.

The system which is the subject of the instant invention differs primarily from other photo-resist systems in that the relief image comprises an ionically bonded polymeric substance. It is based principally on two facts: Firstly, that a mixture of soluble ionic compounds having opposite ionic charges, each of which has more than one charged site, or a soluble compound with a multiplicity of opposite charges, will cross-link ionically, thereby forming insoluble adducts; and secondly, that certain soluble monomers can be photo-polymerized to form polyionic compounds. If these two premises are treated as a system and a soluble, mono-charged ionic monomer is photo-polymerized in the presence of a soluble polyionic compound of opposite charge, or if a soluble monomer with ionic sites of opposite charge is photo-polymerized, an insoluble complex held together by ionic bonds will be obtained. For purposes of this invention, a polyionic compound is considered to include any polymer with a multiplicity of ionic sites.

In the preferred system it has been found to be beneficial to add a photo-polymerization catalyst, for example, one which is capable of producing polymerization-enhancing free radicals easily upon exposure to actinic radiation.

A primary object of the present invention is, therefore, a process for preparing a relief image by photo-polymerizing a soluble ionic reactant, or reactants, to form a substantially insoluble relief image as a function of the point-to-point contact of the reactant, or reactants, to the polymerization-initiating radiation.

An additional object of this invention is a relief image comprising a substantally insoluble, ionically-cross-linked polymeric material.

Another object of this invention is a composition comprising a soluble ionic reactant, or reactants, capable of being photo-polymerized to form a substantially insoluble, ionically-bonded relief image.

Other objects of the invention will in part be obvious and will in part appear hereinafter.

The invention accordingly comprises the several steps and the relation and order of one or more of such steps with respect to each of the others in the product possessing the features, properties and the relation of elements which are exemplified in the following detailed disclosure and the scope of the application of which will be indicated in the claims.

For a fuller understanding of the nature and objects of the invention reference should be had to the following detailed description.

In accordance with the instant invention it has been discovered that:

(A) If a soluble, photo-polymerizable ionic monomer containing ionic sites of different charges, e.g., a zwitterion, is photo-polymerized, a substantially insoluble, ionically cross-linked polymeric relief image will be formed as a function of areawise exposure to the actinic radiation incident upon the monomer, due to the interaction between neighboring polyions which join to form high molecular weight, insoluble, ionically bonded adducts; and (B) If a soluble, photo-polymerizable, mono-charged ionic monomer and a soluble polyionic compound of the opposite charge having more than one ionic site are exposed to actinic radiation, which will initiate polymerization of the monomer, the solubility of the product produced in the exposed areas is substantially less than that of the initial reactants due to the formation of an ionic adduct between the photo-polymerized ionic monomer and the polyion of oppsite charge. Bathing the coated substrate in a suitable solvent will remove the unexposed reactants leaving a high molecular weight insoluble photoresist relief image. The polyionic compound may be preformed or may be formed contemporaneously with the photo-polymerization of the mono-charged ionic monomer by the action of the exciting actinic radiation, as demonstrated in (b), below.

The mono-charged monomer of (B) may be any normally non-gaseous ethylenically unsaturated photopolymerizable ionically charged compound, such as the sodium salt of styrene sulfonic acid, beta(acrylamido) ethyl trimethyl amomnium-p-toluene sulfonate, acrylic acid, sodium acrylate, 2-hydroxy - 3 - methacrylyloxypropyltrimethylamomnium chloride (sold by Shell Chemical Company as G-Mac Methacrylate), 1-vinyl-2-methyl-3-benzylimidazolium chloride (sold by Toho Rayon Company, Ltd. of Japan), etc. Examples of suitable polyionic compounds are: polyionic dyes, for example, direct blue 175 (C.I. 35465); polyionic surfactants, e.g., polynaphthalene sulfonate (Lomar D, sold by Nopcro Chemical Company, Newark, N.J.); the trimethyl ammonium benzaldehyde-p-toluene sulfonate acetal of polyvinyl alcohol; etc.

Ionic monomers containing opposite charges are, for example, zwitterions, such as 4-vinylpyridine-N-butylsulfobetaine,

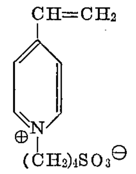

The ionic character of the photopolymerizable monomer and resultant polymer in solution may be provided by the ionization of polymeric salts containing anionic or cationic substituents. Examples of suitable anions which may be pendent on the monomer are: sulfonate; carboxylate; etc. Examples of suitable cations which may be pendent are: quaternary nitrogen, sulfonium salts, phosphonium salts, etc. If the ionic monomer is photo-polymerized in the presence of an oppositely charged polyion to form the resist system the latter polyion must contain suitable ionic groups, as, for example, those mentioned above.

The invention may be best visualized as the ionic linking of polymeric chains in ladder like fashion or like a zipper to form the insoluble adduct. The following diagrammatic representations illustrate the formation of the relief image by the process defined herein, and correspond to (A) and (B) above, respectively.

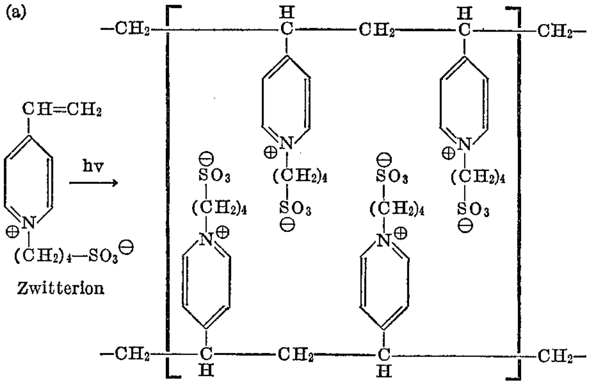

Insoluble Ionically Cross-Linked Poly-Zwitterion

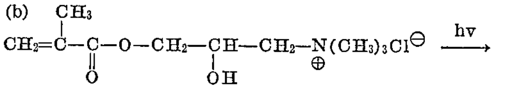

Cationic Monomer

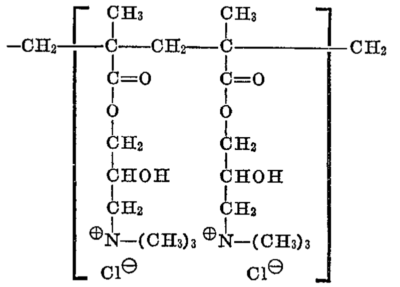

Soluble Photopolymerized Cationic Polymer

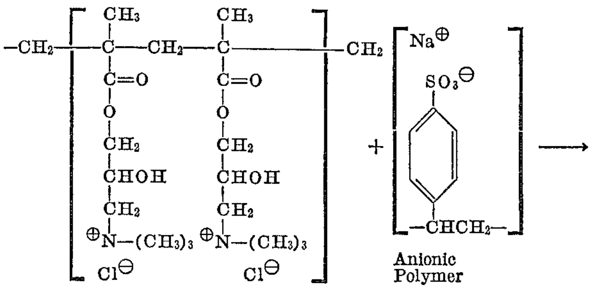

Anionic Polymer

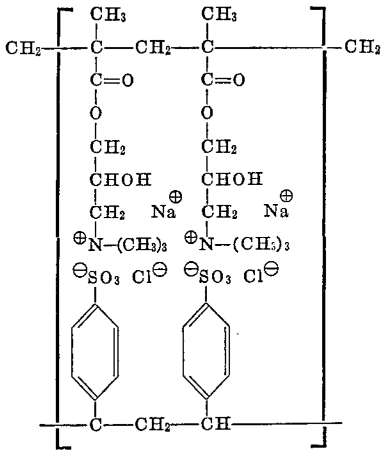

Insoluble Ionically Cross-Linked Polymeric Adduct

Along with the actual ionic reactant, or reactants, a catalyst may be added to accelerate the polymerization reaction and/or to extend the sensitivity of the system to selected wave lengths. These catalysts include photo-reduceable or photo-oxidizable compositions which, upon exposure to actinic radiation, form free radicals thereby hastening polymerization of the reactant, or reactants, with subsequent ionic cross-linking. Any compound which will form a free radical upon being exposed to actinic radiation may be used. Examples are rose bengale, methylene blue, riboflavin, phloxine, erythrosine, eosin, fluorescein, acriflavine, rhodamine B, methyl violet, brilliant green, thionine, methyl orange, water-soluble and fat-soluble chlorophylls, hematoporphyrin, etc.

Agents which take part in the catalysis and hasten free radical formation may also be added. When the catalyst is photo-reduceable, compounds such as allyl thiourea, ascorbic acid, stannous chloride, etc. may be added. When the catalyst is photo-oxidizable, compounds such as zinc oxide, titanium dioxide, etc. may be added. For a further discussion of similar catalysis mechanisms, reference should be made to "Light-Sensitive Systems," Kosar, 1965, published by Wiley. Note particularly, chapter 5.

The resists prepared by the instant invention are found to be dyeable by any water-soluble cationic or anionic dyes, such as methylene blue, rhodamine B, direct blue 175, etc., depending upon the charge balance in the polymeric image, which is discussed below.

In some instances the coating solutions containing the reactants may be of very low viscosity and difficult to apply. Accordingly, an inert binder, such as gelatin, polyvinyl alcohol, etc., may be added as a film former.

It has been found that if the anionic and cationic charges in the system are stoichiometrically balanced the resulting polymeric complex may not be as receptive to ionic dyes as might be desired. If the proportion of the anionic to cationic charges in the starting reactants are chosen so that the resultant polyymeric adduct will have an excess of one charge after ionic cross-linking has taken place, the polymer is found to be receptive to ionic dyes of a charge opposite to the resultant charge on the polymer. It will be evident, therefore, that resists formed by this system from non-stoichiometric proportions of constiuents will have excellent ion exchange properties. For example, if the polyionic resist image has an excess of positive charges and is dipped into a solution containing a mixture of anionic and cationic dyes, the anionic dye will ionically bond while the other will have little effect on the polymeric film. It has also been determined that the more hydrophobic the backbones of the reactants are, the more easily will the insoluble adduct form.

The following examples are given by way of illustration and not limitation. In each instance aqueous coating solutions are used and the exposed resist-forming material is washed with water.

EXAMPLE I

A solution having the following constituents was mixed:

Polystyrene sulfonic acid sodium salt—0.2 gram
2 - hydroxy - 3 - methacrylyloxypropyltrimethylammonium chloride (G-Mac Methacrylate, sold by Shell Chemical Co.)—0.5 gram
Gelatin—0.25 gram
Rose bengale—0.0002 gram
Allyl thiourea—0.0166 gram
Water—3 cc.

The above solution was coated onto a microslide and dried at room temperature. The coated slide was then exposed through a stencil utilizing a 500 watt projection bulb for four minutes. It was then washed with water and allowed to dry. The resulting relief image was of very good quality and exhibited excellent dyeability.

EXAMPLE II

The procedure of Example I was followed using the following solution, except that the exposure time was ten minutes:

2- hydroxy - 3 - methacrylyloxypropyltrimethylammonium chloride (G-Mac Methacrylate, sold by Shell Chemical Co.)—2.5 grams
Sodium polyacrylate (Alcogum An–25, sold by Alco Chemical Corporation)—1.9 grams
Methylene blue—0.0001 gram
Water—6.5 cc.

The resultant relief image was of good quality and was easily dyeable.

EXAMPLE III

The procedure of Example I was carried out using the following solution except that the plate was oven-dried before exposure:

Sodium polyacrylate (Alcogum Pa–15–A, Alco Chemical Corp.)—6.66 grams
2 - hydroxy - 3 - methacrylyloxypropyltrimethylammonium chloride (G-Mac Methacrylate, sold by Shell Chemical Co.)—2.5 grams
Water—10 cc.

The resulting relief image was found to be fair with rather good receptivity to dye.

EXAMPLE IV

The procedure of Example I was carried out using the following solution, except that the exposure time was one minute:

2 - hydroxy - 3 - methacrylyloxypropyltrimethylammonium chloride (G-Mac Methacrylate, sold by Shell Chemical Co.)—3 grams
Direct blue 175 dye (color index 35465)—0.25 gram
Riboflavin—0.0033 gram
Gelatin—1 gram
Water—10 cc.

The quality of the resultant relief image was judged to be excellent. Dye receptivity was also excellent.

EXAMPLE V

The procedure of Example I was carried out using the following solution except that the exposure time was six minutes:

Acryloyl valine sodium salt, 25% solution—3.86 grams
Poly 2 - hydroxy - 3 - methacrylyloxypropyltrimethylammonium chloride (poly G-Mac Methacrylate, sold by Shell Chemical Co.)—1.19 grams
Rose Bengal—0.0002 gram
Water—11 cc.

The acryloyl valine sodium salt was prepared by dissolving valine and sodium hydroxide in water, and adding acryloyl chloride dropwise. The resist image was found to be of good quality with fair dye receptivity.

EXAMPLE VI

The procedure of Example I was carried out using the following solution:

Poly styrene sulfonic acid—2.0 grams
$\beta$ - (Acrylamido) - ethyltrimethyl ammonium p-toluene sulfonate—3.18 grams
Rose Bengal—0.0025 gram
Allyl thiourea—0.0025 gram
Water—8.5 cc.

The $\beta$-(acrylamido)-ethyltrimethyl ammonium p-toluene sulfonate monomer was made by dissolving N,N-dimethyl-ethylenediamine in dichloro methane under $N_2$ and slowly adding acryloyl chloride. Insoluble matter was removed and butylhydroquinone was added to the dichloro methane solution, which was gravity filtered and stripped under vacuum. The residual oil was distilled to give N-[$\beta$-dimethylamino(ethyl)]acrylamide. This product was then reacted with methyl-p-toluene sulfonate in the presence of t-butylhydroquinone. Resultant crystals of $\beta$-(acrylamido)-ethyltrimethyl ammonium p-toluene sulfonate were removed.

The relief image was found to be excellent but was not as receptive to dyeing as the resists formed in the preceding examples.

EXAMPLE VII

The procedure of Example I was carried out using the following solution:

Poly naphthalene sulfonate (Lomar D, Nopco Chemical Co., Newark, N.J.)—5 grams
2-hydroxy - 3 - methacrylyloxypropyltrimethylammonium chloride (G-Mac Methacrylate, sold by Shell Chemical Co.)—2 grams
Rose Bengal—0.0002 gram
Allyl thiourea—0.0166 gram
Gelatin—0.5 gram
Water—3 cc.

The resultant resist image was good and displayed good receptivity to dyes.

EXAMPLE VIII

The procedure of Example I was carried out using the following solution:

4-vinylpyridine N-butylsulfobetaine—1 gram
Gelatin—0.5 gram
Riboflavin—.003 gram
Water—10 cc.

The resultant image was excellent and displayed extremely good dye receptivity.

EXAMPLE IX

The procedure of Example I was carried out using the following solution:

Acryloyl valine sodium salt—1 gram
Trimethylammonium benzaldehyde-p-toluene sulfonate acetal—0.25 gram
Rose Bengal—0.0002 gram
Water—6 cc.

The relief image was very good and evidenced good receptivity to dyes.

Since certain changes may be made in the above-described compositions, process and products without departing from the scope of the invention herein, it is intended that all matter contained in the above description shall be interpreted as illustrative and not in a limiting sense.

What is claimed is:

1. An article comprising a relief image prepared by a process which comprises:
(a) coating a substrate with a solution containing a normally non-gaseous terminally ethylenically unsaturated, ionic monomer having oppositely charged sites and capable of being photo-polymerized to form an ionic addition polymer by exposure to actinic radiation and a catalyst capable of forming free radicals when exposed to actinic radiation in sufficient amount to hasten polymerization of the monomer;
(b) selectively exposing the coated substrate to actinic radiation whereby the monomer is polymerized and forms an ionically cross-linked addition polymer as a function of the point-to-point degree of exposure;
(c) contacting the exposed substrate with a solvent to remove the coating from unexposed areas; and
(d) drying the resultant relief-coated product.

References Cited

UNITED STATES PATENTS

| | | | |
|---|---|---|---|
| 2,832,747 | 4/1958 | Jackson | 260—836 |
| 2,893,868 | 7/1959 | Barney | 96—115 |
| 3,083,118 | 3/1963 | Bridgeford | 96—115X |
| 3,347,676 | 10/1967 | Cripps | 96—115 |
| 3,411,912 | 11/1968 | Dykstra et al. | 260—79.3X |
| 3,113,026 | 12/1963 | Sprung | 96—66X |

GEORGE F. LESMES, Primary Examiner

R. E. MARTIN, Assistant Examiner

U.S. Cl. X.R.

96—35.1; 204—159.22, 159.23; 260—79.3, 561, 875, 885, 886